(12) United States Patent
Yoshii et al.

(10) Patent No.: US 9,209,057 B2
(45) Date of Patent: Dec. 8, 2015

(54) TEMPERATURE CONTROL METHOD, STORAGE MEDIUM STORING A PROGRAM THEREFOR, TEMPERATURE CONTROL APPARATUS, AND HEAT TREATMENT APPARATUS

(75) Inventors: Koji Yoshii, Oshu (JP); Tatsuya Yamaguchi, Sapporo (JP); Wenling Wang, Oshu (JP); Takanori Saito, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 622 days.

(21) Appl. No.: 13/571,011

(22) Filed: Aug. 9, 2012

(65) Prior Publication Data

US 2013/0037534 A1    Feb. 14, 2013

(30) Foreign Application Priority Data

Aug. 10, 2011  (JP) ................. 2011-175175

(51) Int. Cl.
*H05B 1/02*        (2006.01)
*H01L 21/677*      (2006.01)
*H01L 21/67*       (2006.01)

(52) U.S. Cl.
CPC .... *H01L 21/67781* (2013.01); *H01L 21/67248* (2013.01)

(58) Field of Classification Search
CPC ............... H01L 21/67781; H01L 21/67248; H05B 1/023; H05B 1/0233; H05B 1/0038; H05B 1/0047; H05B 2203/005

USPC ........ 219/494, 482–486, 443, 446.1, 448.11, 219/497, 508; 392/415–420
See application file for complete search history.

(56) References Cited

U.S. PATENT DOCUMENTS

| | | | |
|---|---|---|---|
| 2003/0121905 A1* | 7/2003 | Nanno et al. .................. | 219/494 |
| 2004/0098145 A1 | 5/2004 | Zhenduo et al. | |
| 2009/0095422 A1* | 4/2009 | Sugishita et al. ........ | 156/345.27 |

FOREIGN PATENT DOCUMENTS

| | | |
|---|---|---|
| JP | 01-319082 A | 12/1989 |
| JP | 2004-164648 A | 6/2004 |
| JP | 2008-047683 A | 2/2008 |
| JP | 2009-122444 A | 6/2009 |

\* cited by examiner

*Primary Examiner* — Mark Paschall
(74) *Attorney, Agent, or Firm* — Nath, Goldberg & Meyer; Jerald L. Meyer

(57) ABSTRACT

Provided is a method of controlling temperatures of objects to be heated in a heating unit by adjusting a heating rate of each of a plurality of heating elements, based on temperature detection values detected at a plurality of temperature detection elements, wherein the plurality of temperature detection elements are positioned at different positions and the plurality of heating elements are positioned at different positions. The method includes estimating a temperature of each of the plurality of temperature detection elements by using a first estimation algorithm when one of the plurality of temperature detection elements is broken, based on the temperature detection values of the temperature detection elements excluding the broken temperature detection element, and controlling the temperatures of the objects to be heated based on the estimated temperatures.

12 Claims, 8 Drawing Sheets

TEMPERATURE CONTROL METHOD, STORAGE MEDIUM STORING A PROGRAM THEREFOR, TEMPERATURE CONTROL APPARATUS, AND HEAT TREATMENT APPARATUS

CROSS-REFERENCE TO RELATED APPLICATION

This application claims the benefit of Japanese Patent Application No. 2011-175175, filed on Aug. 10, 2011, in the Japan Patent Office, the disclosure of which is incorporated herein in its entirety by reference.

TECHNICAL FIELD

The present disclosure relates to a temperature control method, a recording medium storing a program therefor, a temperature control apparatus, and a heat treatment apparatus.

BACKGROUND

In order to manufacture a semiconductor device, various kinds of processing apparatuses are used for performing processes such as oxidation, diffusion, Chemical Vapor Deposition (CVD) or the like onto a substrate, e.g., a semiconductor wafer. For example, there is known a vertical-type heat treatment apparatus which is capable of performing a heat treatment on a plurality of sheets of substrates to be processed at a time.

Such heat treatment apparatus includes a processing vessel, a boat, an elevation mechanism, and a transfer mechanism. The boat serves as a substrate holding unit that holds a plurality of substrates with a predetermined interval therebetween in a vertical direction, which are loaded into/unloaded from the processing vessel. The elevation mechanism is disposed in a loading area formed below the processing vessel. The elevation mechanism serves to ascend and descend a lid for opening/closing an opening of the processing vessel, with the boat being mounted on the lid, such that the boat can be moved upward and downward between the processing vessel and the loading area. The transfer mechanism serves to transfer the plurality of substrates between the boat in the loading area and a receiving vessel receiving the plurality of substrates therein.

There is an example of a heat treatment apparatus in which a processing vessel is partitioned into a plurality of zones in a longitudinal direction, and similarly, a heater is partitioned into a plurality of zones, each zone being provided with one or more temperature detection elements composed of, e.g., a thermocouple. For example, an inner temperature detection element is disposed corresponding to each zone inside of the processing vessel, and an outer temperature detection element is disposed corresponding to each zone outside of the processing vessel.

However, such a heat treatment apparatus suffers from the following drawbacks.

In a heat treatment operation of the heat treatment apparatus, when a temperature detection element disposed in a certain zone (or unit region) is broken, a detection value of the broken temperature detection element is switched to a calculation value, which is calculated from an actual sampling measurement value based on a dynamic model so that a temperature control is achieved. In this configuration, the dynamic model is derived for every unit region. Thus, this fails to precisely calculate the temperature of the broken temperature detection element since it does not take into account the effect of the temperatures of other unit regions on the temperature of the certain unit region.

Additionally, it has been proposed that when one of the inner and outer temperature detection elements is broken, the unbroken temperature detection element can be used as a temperature detection element for temperature control instead of the broken temperature detection element. However, such switching may cause a fluctuation in the temperature of a substrate. Particularly, when increasing or decreasing the temperature of the substrate, the switching operation that switches to one of the inner and outer temperature detection elements as the temperature detection element for temperature control may cause a large fluctuation in the temperature of the substrate.

Such fluctuation may occur not only when the substrates are held in a vertical direction, but also when the substrates are held in other directions with a predetermined interval. In addition, the fluctuation may occur not only when substrates are subjected to heat treatment, but also when other various kinds of objects to be heated are subjected to heat treatment.

SUMMARY

The present disclosure provides a temperature control method, a temperature control apparatus and a heat treatment apparatus in which, even when a temperature detection element for temperature control is broken, a temperature of an object to be heated is continuously controlled without substantially fluctuating the temperature of the object to be heated.

According to one embodiment of the present disclosure, provided is a method of controlling temperatures of objects to be heated in a heating unit by adjusting a heating rate of each of a plurality of heating elements, based on temperature detection values detected at a plurality of temperature detection elements, the plurality of temperature detection elements being positioned at different positions and the plurality of heating elements being positioned at different positions, the method including: estimating a temperature of each of the plurality of temperature detection elements by using a first estimation algorithm for estimating the temperature of each of the plurality of temperature detection elements when one of the plurality of temperature detection elements is broken, based on the temperature detection values detected at the plurality of temperature detection elements excluding the broken temperature detection element; and controlling the temperatures of the objects to be heated based on the estimated temperatures.

According to another embodiment of the present disclosure, provided is a temperature control apparatus, including: a plurality of temperature detection elements, each of the temperature detection elements being positioned at different positions; a heating unit provided with a plurality of heating elements, each of the heating elements being positioned at different positions, and configured to heat objects to be heated; and a control unit configured to adjust a heating rate of each of the plurality of heating elements in the heating unit, based on temperature detection values detected at the plurality of temperature detection elements, and configured to control temperatures of the objects to be heated, wherein, the control unit is further configured to estimate a temperature of each of the plurality of temperature detection elements by using a first estimation algorithm for estimating the temperature of each of the plurality of temperature detection elements when one of the plurality of temperature detection elements is broken, based on the temperature detection values detected at the plurality of temperature detection elements excluding the broken temperature detection element, and configured to control the temperatures of the objects to be heated based on the estimated temperatures.

According to another embodiment of the present disclosure, provided is a heat treatment apparatus for performing a heat treatment on substrates, including: a processing vessel; a substrate holding unit disposed in the processing vessel and configured to hold the substrates with a predetermined interval therebetween along one direction; a heating unit provided with a plurality of heating elements, each of the heating elements being positioned at different positions along the one direction, and configured to heat the substrates held by the substrate holding unit in the processing vessel; a plurality of temperature detection elements, each of the temperature detection elements being positioned at different positions along the one direction; and a control unit configured to adjust a heating rate of each of the plurality of heating elements in the heating unit, based on temperature detection values detected at the plurality of temperature detection elements and configured to control temperatures of the substrates, wherein the control unit is further configured to estimate a temperature of each of the plurality of temperature detection elements by using a first estimation algorithm for estimating the temperature of each of the plurality of the temperature detection elements when one of the plurality of temperature detection elements is broken, based on the temperature detection values detected at the plurality of temperature detection elements excluding the broken temperature detection element, and configured to control the temperatures of the substrates based on the estimated temperatures.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Firstly, a heat treatment apparatus according to one embodiment of the present disclosure will be explained. A heat treatment apparatus 10 includes a vertical-type heat treatment furnace 60 (to be described later) configured to receive a boat in which a plurality of wafers W are held with a predetermined vertical interval therebetween at a time. The heat treatment apparatus 10 is capable of performing various heat treatments such as oxidation, diffusion, Low Pressure Chemical Vapor Deposition (LPCVD) or the like. For example, a heat treatment apparatus that performs an oxidation process on the surfaces of the substrates by supplying a process gas formed of, e.g., water vapor to the substrates disposed within a processing vessel 65 (to be described later) will be explained.

Figure 1:
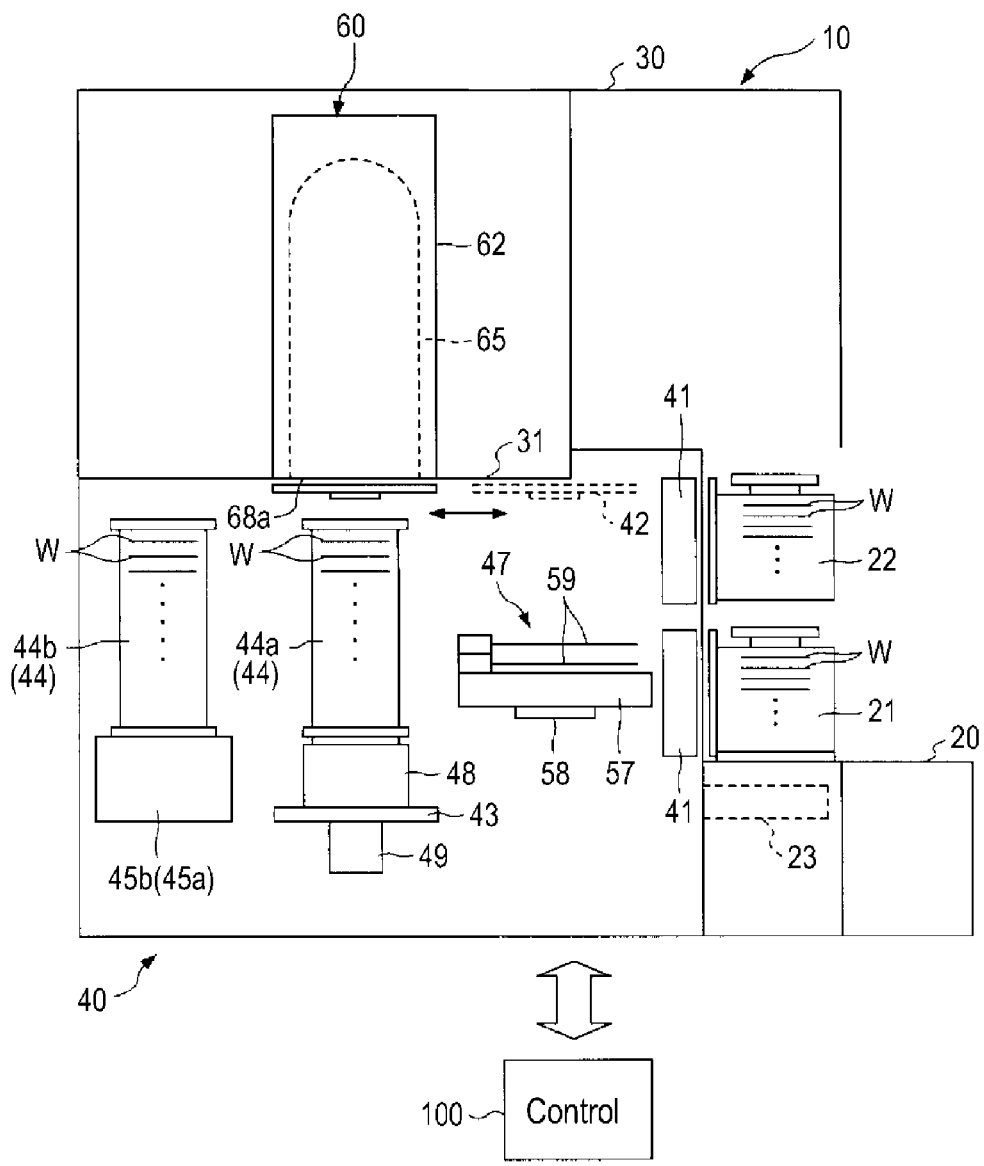
FIG. 1 is a longitudinal sectional view schematically showing a heat treatment apparatus according to one embodiment of the present disclosure.
Figure 2:
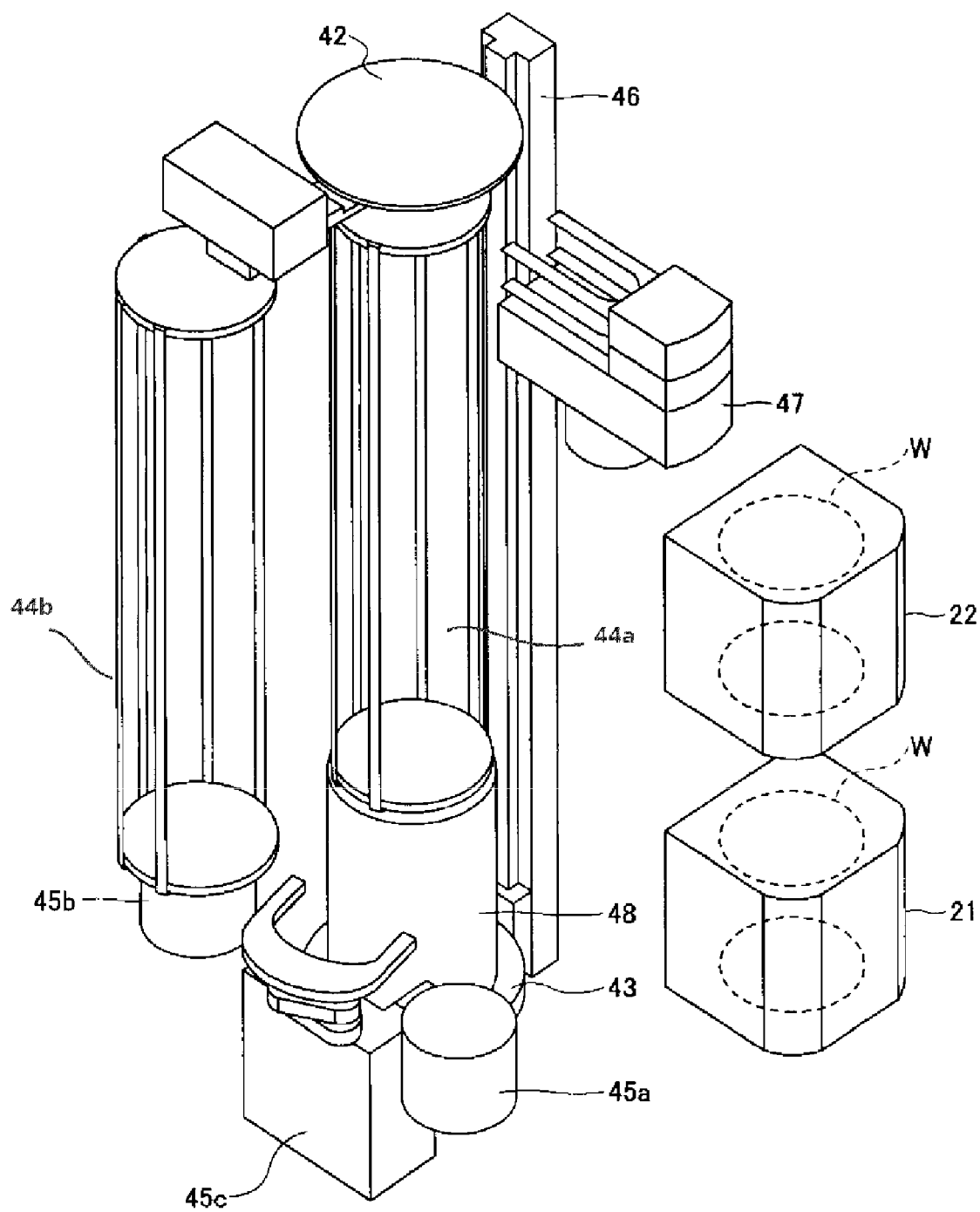
FIG. 2 is a schematic perspective view of a loading area.
Figure 3:
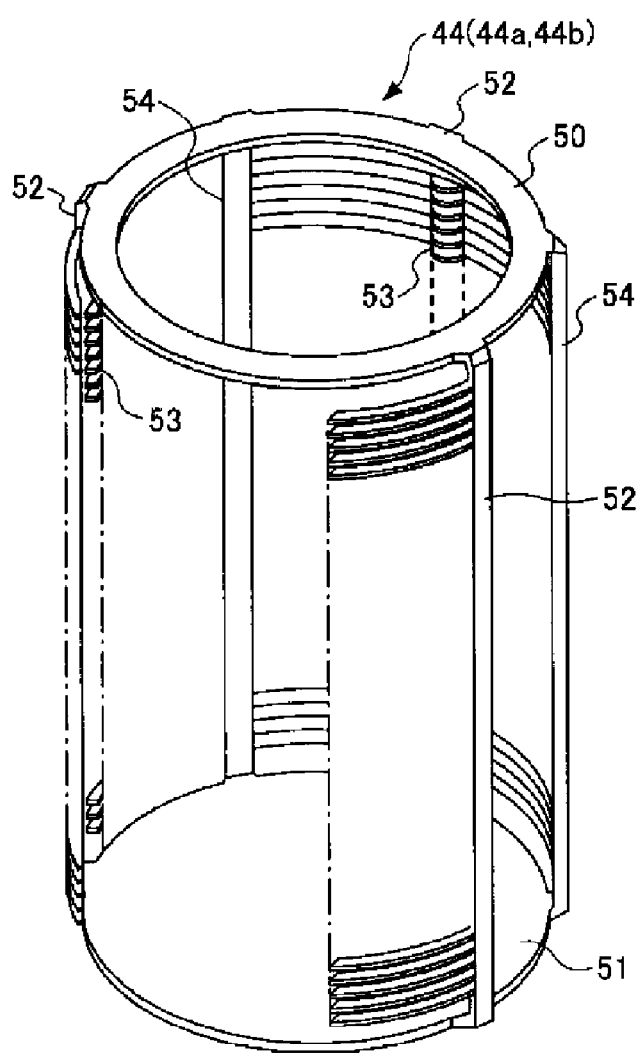
FIG. 3 is a perspective view schematically showing one example of a boat.

FIG. 1 is a longitudinal sectional view schematically showing the heat treatment apparatus 10 according to one embodiment of the present disclosure. FIG. 2 is a schematic perspective view of a loading area 40. FIG. 3 is a perspective view schematically showing one example of a boat 44.

The heat treatment apparatus 10 includes a mounting table (load port) 20, a housing 30, and a control unit 100.

The mounting table 20 is mounted in the front portion (i.e., the right side in FIG. 1) of the housing 30. The housing 30 is provided with the loading area (work area) 40 and the heat treatment furnace 60. The loading area 40 is formed in a lower portion of the housing 30. The heat treatment furnace 60 is mounted above the loading area 40 within the housing 30. A base plate 31 is installed between the loading area 40 and the heat treatment furnace 60.

The mounting table 20 is used to load/unload wafers W into/from the housing 30. Receiving vessels 21 and 22 are mounted on the mounting table 20. Each of the receiving vessels 21 and 22 is a closed-type receiving vessel (e.g., FOUP (Front-Opening Unified Pod)) having a detachable lid (not shown) installed at its front side, which is configured to receive a plurality of, e.g., 50, wafers W with a predetermined interval therebetween.

Further, an aligning device (aligner) 23 may be disposed below the mounting table 20. The aligning device 23 is configured to align the wafers W with cutoff portions (e.g., notches) formed on the peripheries of the wafers W in one direction. The wafers W are transferred by a transfer mechanism 47 (will be described later).

The loading area 40 is used for transferring the wafers W between the receiving vessels 21 and 22 and the boat 44 (will be described later), loading the boat 44 into the processing vessel 65, and unloading the boat 44 from the processing vessel 65. The loading area 40 is provided with a door mechanism 41, a shutter mechanism 42, a lid 43, the boat 44, bases 45a and 45b, an elevating mechanism 46 (see FIG. 2), and the transfer mechanism 47.

The lid 43 and the boat 44 correspond to a substrate supporting unit of the present disclosure.

The door mechanism 41 is configured to open each lid of the receiving vessels 21 and 22 such that the receiving vessels 21 and 22 communicate internally with the loading area 40.

The shutter mechanism 42 is disposed in the top portion of the loading area 40. When the lid 43 is opened, the shutter mechanism 42 is configured to cover (or close) a furnace opening 68a (will be described later) so as to suppress or prevent a high temperature heat within the heat treatment furnace 60 from being discharged into the loading area 40.

The lid 43 includes a heat insulation tube 48 and a rotating mechanism 49. The heat insulation tube 48 is disposed on the lid 43. The heat insulation tube 48 prevents the boat 44 from being cooled by heat transfer between the boat 44 and the lid 43, thereby thermally insulating the boat 44. The rotating mechanism 49 is attached to the lower portion of the lid 43. The rotating mechanism 49 is configured to rotate the boat 44. A rotation shaft (not shown) of the rotating mechanism 49 hermetically penetrates the lid 43 to rotate a rotatable table (not shown) disposed on the lid 43.

The elevating mechanism 46 is configured to move the lid 43 upward and downward during the loading and unloading operations of the boat 44 into and from the processing vessel 65. When the lid 43 moved upward by the elevating mechanism 46 is loaded into the processing vessel 65, the lid 43 is brought into contact with the furnace opening 68a (will be described later) to close the furnace opening 68a. The boat 44 mounted on the lid 43 is capable of horizontally and rotatably holding the wafers W within the processing vessel 65.

Further, the heat treatment apparatus 10 may include a plurality of the boats 44. Hereinafter, a description will be given to the heat treatment apparatus 10 including two boats 44 (i.e., 44a and 44b) with reference to FIG. 2.

The boats 44a and 44b are disposed in the loading area 40. Also, the loading area 40 is provided with the bases 45a and 45b, and a boat transfer mechanism 45c. The bases 45a and 45b are mounting tables on which respective boats 44a and 44b are mounted from the lid 43, respectively. The boat transfer mechanism 45c is configured to transfer the boats 44a and 44b from the lid 43 to respective bases 45a and 45b.

The boats 44a and 44b are made of, e.g., quartz, and are configured to horizontally hold the wafers W having a large diameter of, e.g., 300 mm, at a predetermined vertical interval (or pitch width) therebetween. For example, as shown in FIG. 3, the boats 44a and 44b are formed by interposing a plurality of, e.g., three, pillars 52 between a ceiling plate 50 and a bottom plate 51. A plurality of arm portions 53 are formed in each of the pillars 52 to hold the wafers W. Further, a plurality of auxiliary pillars 54 may be formed in addition to the three pillars 52.

The transfer mechanism 47 is configured to transfer the wafers W between the receiving vessels 21 and 22 and the boats 44a and 44b. The transfer mechanism 47 includes a base 57, an elevating arm 58, and a plurality of forks (or transfer plates) 59. The base 57 is configured to move in a vertical direction and to rotate. The elevating arm 58 is installed to vertically move (ascend or descend) through, e.g., a ball screw. The base 57 is installed to horizontally rotate with respect to the elevating arm 58.

Figure 4:
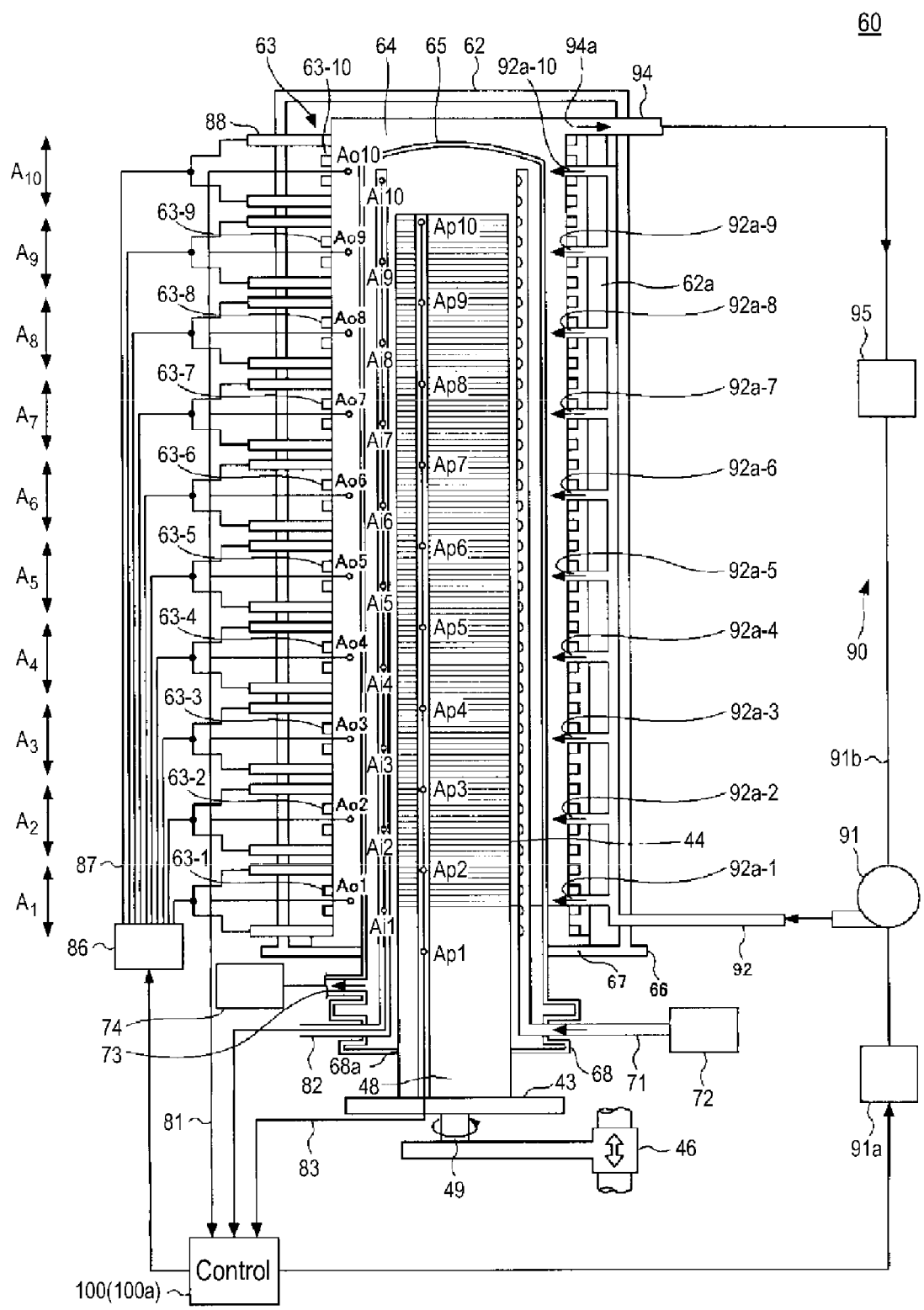
FIG. 4 is a side-elevational view schematically showing a configuration of a heat treatment furnace.

FIG. 4 is a side-elevational view schematically showing a configuration of the heat treatment furnace 60.

The heat treatment furnace 60 may be a vertical furnace configured to accommodate a plurality of substrates, e.g., disc-shaped thin plate wafers W, to be processed, and to perform a predetermined heat treatment thereto.

The heat treatment furnace 60 includes a jacket 62, a heater 63, a space 64 and the processing vessel 65.

The processing vessel 65 is configured to receive the wafers W held in the boat 44 and perform a heat treatment thereto. The processing vessel 65 is formed of, e.g., quartz, and has a lengthwise long shape.

The processing vessel 65 is supported by the base plate 31 through a manifold 68 disposed below the processing vessel 65. Process gas is supplied from the manifold 68 into the processing vessel 65 through an injector 71. The injector 71 is connected to a gas supply source 72. Also, the process gas or purge gas supplied into the processing vessel 65 is flowed to an exhaust system 74 including a vacuum pump for decompression control through an exhaust port 73.

As described above, when the boat 44 is loaded into the processing vessel 65, the lid 43 opens and closes the furnace opening 68a formed in the lower portion of the manifold 68. As described above, the lid 43 is installed to vertically move by the elevating mechanism 46. The heat insulation tube 48 is mounted on the lid 43. Above the heat insulation tube 48 is disposed the boat 44 configured to hold the plurality of wafers W with a predetermined vertical interval therebetween.

The jacket 62 is installed to cover a periphery of the processing vessel 65 and to form the space 64 in the periphery of the processing vessel 65. The processing vessel 65 has a cylindrical shape and the jacket 62 also has a cylindrical shape corresponding thereto. The jacket 62 is supported by a base plate 66. A heat insulating member 62a made of, e.g., a glass wool, is installed in the inside of the jacket 62 and the outside of the space 64.

The heater 63 is installed to cover the periphery of the processing vessel 65, and is configured to heat the processing vessel 65 and to also heat the wafers W held in the boat 44, i.e., the objects to be heated in the processing vessel 65. The heater 63 is installed in the inside of the jacket 62 and the outside of the space 64. The heater 63, which is formed of a heat generation resistor such as a carbon wire, is configured to control a temperature of gas flowing through the inside of the space 64 and to also control the internal temperature of the processing vessel 65 within a predetermined range of heat temperatures, e.g., 50 to 1200 degrees C. The heater 63 acts as a heating unit configured to heat the processing vessel 65 and the wafers W.

The space 64 and a space defined within the processing vessel 65 are partitioned into a plurality of, e.g., ten unit regions $A_1$, $A_2$, $A_3$, $A_4$, $A_5$, $A_6$, $A_7$, $A_8$, $A_9$ and $A_{10}$, along a longitudinal direction. Also, the heater 63 is partitioned into ten heating elements 63-1, 63-2, 63-3, 63-4, 63-5, 63-6, 63-7, 63-8, 63-9 and 63-10, corresponding to the ten unit regions along the longitudinal direction. A heater output unit 86 formed of, e.g., a thyristor, is configured to individually control outputs of each of the heating elements 63-1 to 63-10 in correspondence with each of the unit regions $A_1$ to $A_{10}$. Each of the heating elements 63-1 to 63-10 corresponds to a heating element of the present disclosure.

In the above embodiment, the space 64 and the space in the processing vessel 65 have been described to be partitioned into ten unit regions along the longitudinal direction, but are not limited thereto. For example, the space 64 and the space in the processing vessel 65 may be partitioned into a number of regions other than ten unit regions. Further, although in this embodiment, the unit regions have been shown to be evenly partitioned, the present disclosure is not limited thereto. In some embodiments, the vicinity of the furnace opening 68a having a large change in temperature may be partitioned into relatively small regions.

Further, each of the heating elements 63-1 to 63-10 of the heater 63 may be disposed at different positions along the longitudinal direction. In this case, each of the heating elements 63-1 to 63-10 of the heater 63 may not be disposed with respect to each of the unit regions A1 to A10 on a one-to-one basis.

In the space 64, a plurality of heater temperature sensors Ao1 to Ao10 (collectively referred to as "Ao" hereinafter) are disposed to detect the temperatures corresponding to the unit regions A1 to A10. Further, in the space in the processing vessel 65, a plurality of in-vessel temperature sensors Ai1 to Ai10 (collectively referred to as "Ai" hereinafter) are also disposed to detect the temperatures corresponding to the unit regions A1 to A10. The heater temperature sensors Ao and the in-vessel temperature sensors Ai detect temperatures at the respective unit regions A1 to A10 so as to obtain a temperature distribution along the longitudinal direction.

Detection signals of the heater temperature sensors Ao and detection signals of the in-vessel temperature sensors Ai are directed to the control unit 100 through lines 81 and 82, respectively. Based on the detection signals, the control unit 100 calculates a set value of the heater output unit 86 and sends the calculated set value to the heater output unit 86. The heater output unit 86 outputs the calculated set value provided from the control unit 100 to each of the heating elements 63-1 to 63-10 through heater output lines 87 and heater terminals 88 connected respectively thereto. The control unit 100 calculates the set value of the heater output unit 86 using, e.g., a PID control, thereby controlling the output of the heater output unit 86 to each of the heating elements 63-1 to 63-10, i.e., a heating rate of each of the heating elements 63-1 to 63-10.

Next, a method of calculating set values for the heater output unit 86 in the control unit 100, i.e., a temperature control method, will be described with reference to FIGS. 5 and 6.

In order to detect a longitudinal temperature distribution in the processing vessel 65, each of the heater temperature sensors Ao and each of the in-vessel temperature sensors Ai may be disposed at different positions along the longitudinal direction. In this case, the heater temperature sensors Ao and the in-vessel temperature sensors Ai may not necessarily be disposed in correspondence with each of the unit regions A1 to A10 on a one-to-one basis.

Further, as shown in FIG. 4, movable temperature sensors Ap1 to Ap10, which are loaded and unloaded together with the wafers W, may be disposed in the processing vessel 65. Detection signals of the movable temperature sensors Ap1 to Ap10 may be directed to the control unit 100 through a line 83.

The heat treatment furnace 60 may further include a cooling mechanism 90 to cool the processing vessel 65. The cooling mechanism 90 may include, for example, a ventilator (or air blower) 91, a blower pipe 92, and an exhaust pipe 94.

The ventilator 91 is configured to blow a cooling gas formed of, e.g., air, into the space 64 in which the heater 63 is disposed, thereby cooling the processing vessel 65. The blower pipe 92 flows the cooling gas from the ventilator 91 to the heater 63. The blower pipe 92 is connected to each of a plurality of injection openings 92a-1 to 92a-10. Specifically, the cooling gas is supplied to the space 64 via each of the injection openings 92a-1 to 92a-10. In the example shown in FIG. 4, the injection openings 92a-1 to 92a-10 are disposed along the longitudinal direction.

The exhaust pipe 94 is used to exhaust air in the space 64. An exhaust opening 94a is formed in the space 64 to exhaust the cooling gas therethrough. One end of the exhaust pipe 94 is connected to the exhaust opening 94a.

As shown in FIG. 4, a heat exchanger 95 is installed at the middle of the exhaust pipe 94, and the other end of the exhaust pipe 94 is connected to a suction side of the ventilator 91. The cooling gas exhausted through the exhaust pipe 94, without being discharged to a factory exhaust system, may be heat-exchanged at the heat exchanger 95, and then may return to the ventilator 91 via a pipe 91b such that the cooling gas is circulated. In this case, the cooling gas may be circulated via an air filter (not shown). Alternatively, the cooling gas discharged from the space 64 may be exhausted from the exhaust pipe 94 to a factory exhaust system via the heat exchanger 95.

Further, the control unit 100 may be configured to control power to the ventilator 91 from a power supply part 91a composed of, e.g., an inverter, thereby adjusting an airflow of the ventilator 91.

The control unit 100 may include, for example, an operation processing unit 100a, a storage unit and a display unit, which are not shown in FIG. 4. For example, the operation processing unit 100a may be a computer equipped with CPU (Central Processing Unit). The storage unit may be a computer-readable storage medium such as a hard disk for storing operation programs that causes the computer to execute various kinds of processes. The display unit may be composed of, e.g., a screen of the computer. The operation processing unit 100a is configured to read the operation programs stored in the storage unit, and transmit control signals to respective parts of the heat treatment apparatus 10 based on the read operation programs. In this way, a heat treatment operation (will be described later) is performed.

Further, in order to efficiently converge temperatures of the wafers W to be heated in the processing vessel 65 to a set temperature (or a predetermined temperature), the control unit 100 stores a program (or sequence) to cause the control unit 100 to adjust a level of electric power to the heater 63.

In this embodiment, the control unit 100 estimates a temperature of each of a plurality of temperature detection elements and controls the temperature of each wafer W based on the estimated temperature. When none of the temperature detection elements are broken, the control unit 100 predicts a temperature of each of the plurality of temperature detection elements using a Kalman filter for a normal situation. However, when one of the temperature detection elements is broken, the control unit 100 estimates a temperature of each of the plurality of temperature detection elements using a Kalman filter for an abnormal situation. The Kalman filter for the normal situation is prepared based on temperature detection values detected by each of the plurality of temperature detection elements when none of the temperature detection elements are broken. The Kalman filter for the abnormal situation is prepared based on temperature detection values detected by temperature detection elements other than a selected temperature detection element when any one of the temperature detection elements is not broken.

The following is a detailed description of a configuration of the operation processing unit 100a and a temperature control method according to one embodiment of the present disclosure.

In the temperature control method according to one embodiment, a feedback control is performed on a temperature which is a status variable of an object to be controlled and an estimation value is generated for an undetectable temperature by, e.g., an estimation algorithm based on a Kalman filter, when some temperatures become undetectable.

Next, a description will be given as to one embodiment in which the Kalman filter for the normal situation is switched to the Kalman filter for the abnormal situation, for example, when one of the in-vessel temperature sensors Ai among the heater temperature sensors Ao and the in-vessel temperature sensors Ai is broken. For the sake of simplicity, it is assumed that the unit regions are partitioned into five regions, i.e., A1 to A5. Specifically, it is assumed that five in-vessel temperature sensors Ai1 to Ai5 and five heating elements 63-1 to 63-5 are installed.

Figure 5:
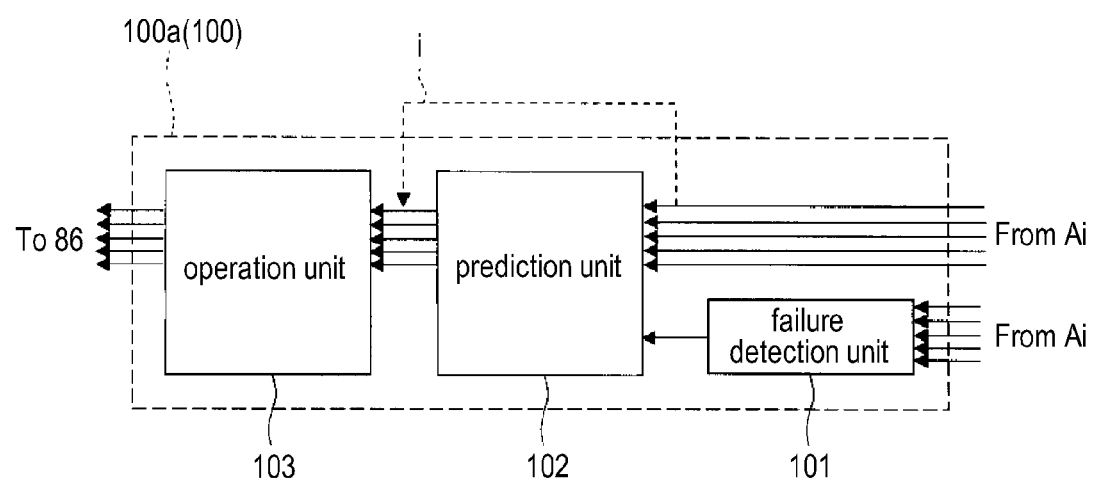
FIG. 5 is a schematic representation showing a configuration of an operation unit.

FIG. 5 is a representation schematically showing a configuration of the operation processing unit 100a.

As shown in FIG. 5, the operation processing unit 100a includes a failure detection unit 101, a prediction unit 102, and an operation unit 103.

The failure detection unit 101 is connected to the in-vessel temperature sensors Ai1 to Ai5 through a line (not shown) that is disposed separately from the line 82 which connects between the in-vessel temperature sensors Ai1 to Ai5 and the prediction unit 102 of the operation processing unit 100a. Further, the failure detection unit 101 is configured to detect whether one of the in-vessel temperature sensors Ai1 to Ai5 is disconnected using, e.g., an electrical method.

The operation unit 103 calculates an output value to be outputted to the heater 63 based on a prediction value provided from the prediction unit 102.

The prediction unit 102 predicts a temperature of each of the five in-vessel temperature sensors Ai1 to Ai5 using the Kalman filter.

Hereinafter, descriptions will be given as to a method of preparing the Kalman filter, and a method of predicting the temperature of one of the in-vessel temperature sensors Ai1 to Ai5 using the prepared Kalman filter by the prediction unit 102.

Firstly, a method of preparing the Kalman filter for the normal situation, which is used when none of the in-vessel temperature sensors are broken, will be described. The Kalman filter for the normal situation corresponds to a second Kalman filter of the present disclosure.

A linear system as an estimation target may be given by the following equation Eq. (1).

$$x(k+1)=Ax(k)+Bu(k)$$

$$y(k)=Cx(k) \qquad \text{Eq. (1)}$$

wherein, x represents a state vector of n rows×1 column, u represents an input vector of r rows×1 column, y represents an output vector of m rows×1 column, A represents a state matrix of n rows×n columns, B represents an input matrix of n rows×r columns, and C represents an output matrix of m rows×n columns. Herein, if an observable variable of y is defined as $y_o$, $y_o$ may be defined in the following equation Eq. (2).

$$x(k+1)=Ax(k)+Bu(k)+w(k)$$

$$y_o(k)=C_o Cx(k)+v_o(k) \qquad \text{Eq. (2)}$$

wherein, $y_o$ represents an observation vector of o rows×1 column, and $C_o$ represents an observation value selection vector of o rows×m columns. Also, both w and $v_o$ represent Gaussian white noise vectors of an average value 0, w being a process noise vector of n rows×1 column, and $v_o$ being an observation noise vector of o rows×1 column. It is assumed that covariance matrixes $R_o$ for w and $v_o$ are given as follows:

$$E\left\{\begin{bmatrix} w(k) \\ v_o(k) \end{bmatrix} \begin{bmatrix} w^T(l) & v_o^T(l) \end{bmatrix}\right\} = \begin{bmatrix} Q & 0 \\ 0 & R_o \end{bmatrix}\delta, R_o > 0 \qquad \text{Eq. (3)}$$

$$E\{w(k)x^T(l)\} = 0, E\{v_o(k)x^T(l)\} = 0, k \geq l \qquad \text{Eq. (4)}$$

Herein, E{ } represents an expectation value. In the above equations Eqs. (3) and (4), $R_o$ is a vector of o rows×o columns.

A state estimation problem is to evaluate a minimum variance estimation value for a state x(k+h) at a time k+h, in other words, to design a filter for providing an equation Eq. (6) that minimizes an evaluation function as expressed in the following equation Eq. (5).

$$J=E\{\|x(k+h)-\hat{x}(k+h)\|^2\} \qquad \text{Eq. (5)}$$

$$\hat{x}(k+h) \qquad \text{Eq. (6)}$$

Further, it is assumed that a covariance matrix for estimation error is given as the following equation Eq. (7).

$$P(k|k)=E\{[x(k)-\hat{x}(k|k)][x(k)-\hat{x}(k|k)]^T\}$$

$$P(k+1|k)=E\{[x(k+1)-\hat{x}(k+1)][x(k+1)-\hat{x}(k+1|k)]^T\} \qquad \text{Eq. (7)}$$

wherein, P represents a covariance matrix for estimation error of n rows×n columns. Also, (k|k) represents a parameter which depicts an update of a time and an observation.

A Kalman filter when receiving a control input may be expressed as the following equations Eq. (8) to Eq. (12).

Filter Equations $$\text{(Time Update) } \hat{x}(k+1|k)=A\hat{x}(k|k)+Bu(k) \qquad \text{Eq. (8)}$$

$$\text{(Observation Update) } \hat{x}(k|k)=\hat{x}(k|k-1)+K(k)[y-C_o C\hat{x}(k|k-1)] \qquad \text{Eq. (9)}$$

Covariance Equations $$\text{(Time Update) } P(k+1|k)=AP(k|k)A^T+Q \qquad \text{Eq. (10)}$$

$$\text{(Observation Update) } P(k|k)=P(k|k-1)-K(k)C_o CP(k|k-1) \qquad \text{Eq. (11)}$$

Kalman Gain $$K(k)=P(k|k-1)C^T C_o^T[C_o CP(k|k-1)C^T C_o^T+R_o]^{-1} \qquad \text{Eq. (12)}$$

In the above equations Eqs. (8) to (12), $C_o$ represents an observation value selection matrix of o rows×m columns, Q represents a covariance matrix for process noise of n rows×n columns, and K represents a Kalman gain of n rows×o columns.

Substituting the equation Eq. (9), which depicts the observation update of the filter equation, into the equation Eq. (8), which depicts the time update of the filter equation, yields the following equation Eq. (13).

$$\hat{x}(k+1)=A[\hat{x}(k)+K(k)[y_o(k)-C_o C\hat{x}(k)]]+Bu(k) \qquad \text{Eq. (13)}$$

The above equation Eq. (13) can be written in an alternative form as the following equation Eq. (14).

$$\hat{x}(k+1)=A\hat{x}(k)+Bu(k)+AK(k)[y_o(k)-C_o C\hat{x}(k)] \qquad \text{Eq. (14)}$$

Assuming that the covariance matrix is normal, the Kalman gain K becomes normal as defined in the following equation Eq. (15).

$$K=PC^T C_o^T[C_o CPC^T C_o^T+R_o]^{-1} \qquad \text{Eq. (15)}$$

wherein, $R_o$ is a covariance matrix for observation noise of o rows×o columns.

Substituting the equation Eq. (11), which depicts the observation update of the covariance equation, into the equation Eq. (10), which depicts the time update of the covariance equation, yields the following equation Eq. (16).

$$P(k+1|k)=A[P(k|k-1)-KC_o CP(k|k-1)]A^T+Q \qquad \text{Eq. (16)}$$

Assuming that the covariance matrix is normal, the covariance matrix may be defined as the following equation Eq. (17).

$$P=APA^T-A[KC_o CP]A^T+Q \qquad \text{Eq. (17)}$$

Further, substituting the K value as defined in equation Eq. (15) into equation Eq. (17) results in an algebraic Riccati equation as defined in the following equation Eq. (18).

$$P=APA^T-APC^T C_o^T[C_o CPC^T+R]^{-1}C_o CPA^T+Q \qquad \text{Eq. (18)}$$

The value P can be calculated by solving the algebraic Riccati equation as expressed in equation Eq. (18). Upon calculation of the value P, the normal Kalman gain K may be obtained by the above equation Eq. (15).

The following is a description of a method of preparing the Kalman filter for the abnormal situation, which is used when one of the in-vessel temperature sensors (simply referred to as a "temperature sensor" hereinafter) is broken. The Kalman filter for the abnormal situation corresponds to a first Kalman filter of the present disclosure.

Here, a Kalman filter is designed on the assumption that a first temperature sensor is broken.

Assuming that a value obtained by subtracting an output of the first temperature sensor from the observable variable $y_o$ is $y_1$, an equation corresponding to the equation Eq. (2) for the Kalman filter for the normal situation may be given as follows:

$$x(k+1)=Ax(k)+Bu(k)+w(k)$$

$$y_1(k)=C_1Cx(k)+v_1(k) \qquad \text{Eq. (19)}$$

wherein, $y_1$ represents an observation vector of (o-1) rows×1 column, $C_1$ represents an output matrix of (o-1) rows×m columns, and $v_1$ represents an observation noise vector of (o-1) rows×1 column. Descriptions for matrices shared with the equation Eq. (2) will be omitted (similarly, as to equations which will be described later).

Similar to when the temperature sensor is normal, the Kalman filter is designed for the system described above.

A filter equation of the Kalman filter may be given as follows:

$$\hat{x}(k+1)=A\hat{x}(k)+Bu(k)+AK_1[y_1(k)-C_1C\hat{x}(k)] \qquad \text{Eq. (20)}$$

In this case, the Kalman gain may be driven as the following equation Eq. (21).

$$K_1=P_1C^TC_1^T[C_1CP_1C^TC_1^T+R_1]^{-1} \qquad \text{Eq. (21)}$$

wherein, $K_1$ represents a Kalman gain of n rows×(o-1) columns, and $R_1$ represents a covariance matrix for observation noise of (o-1) rows×(o-1) columns.

The algebraic Riccati equation may be given as the following equation Eq. (22).

$$P_1=AP_1A^T-AP_1C^TC_1^T[C_1CP_1C^TC_1^T+R_1]^{-1}C_1CP_1A^T+Q \qquad \text{Eq. (22)}$$

Similarly, when an ith temperature sensor is broken, a filter equation may be calculated as the following equation Eq. (23).

$$\hat{x}(k+1)=A\hat{x}(k)+Bu(k)+AK_i[y_i(k)-C_iC\hat{x}] \qquad \text{Eq. (23)}$$

Each Kalman gain may be given as the following equation Eq. (24).

$$K_i=P_iC^TC_i^T[C_iCP_iC^TC_i^T+R_i]^{-1} \qquad \text{Eq. (24)}$$

In the above equations Eqs. (23) and (24), $C_i$ represents an output matrix of (o-1) rows×m columns, $K_i$ represents a Kalman gain of n rows×(o-1) columns, and $R_i$ represents a vector of (o-1) rows×(o-1) columns.

Each algebraic Riccati equation may be given as the following equation Eq. (25).

$$P_i=AP_iA^T-AP_iC^TC_i^T[C_iCP_iC^T+R_i]^{-1}C_iCP_iA^T+Q \qquad \text{Eq. (25)}$$

Next, a description will be made as to a method of preparing Kalman filters in normal and abnormal situations. FIG. 6 is a longitudinal elevational view schematically showing an illustrative heat treatment apparatus which is simplified by decreasing the number of unit regions. FIG. 7 is a schematic block diagram showing a configuration of the prediction unit 102.

Figure 6:
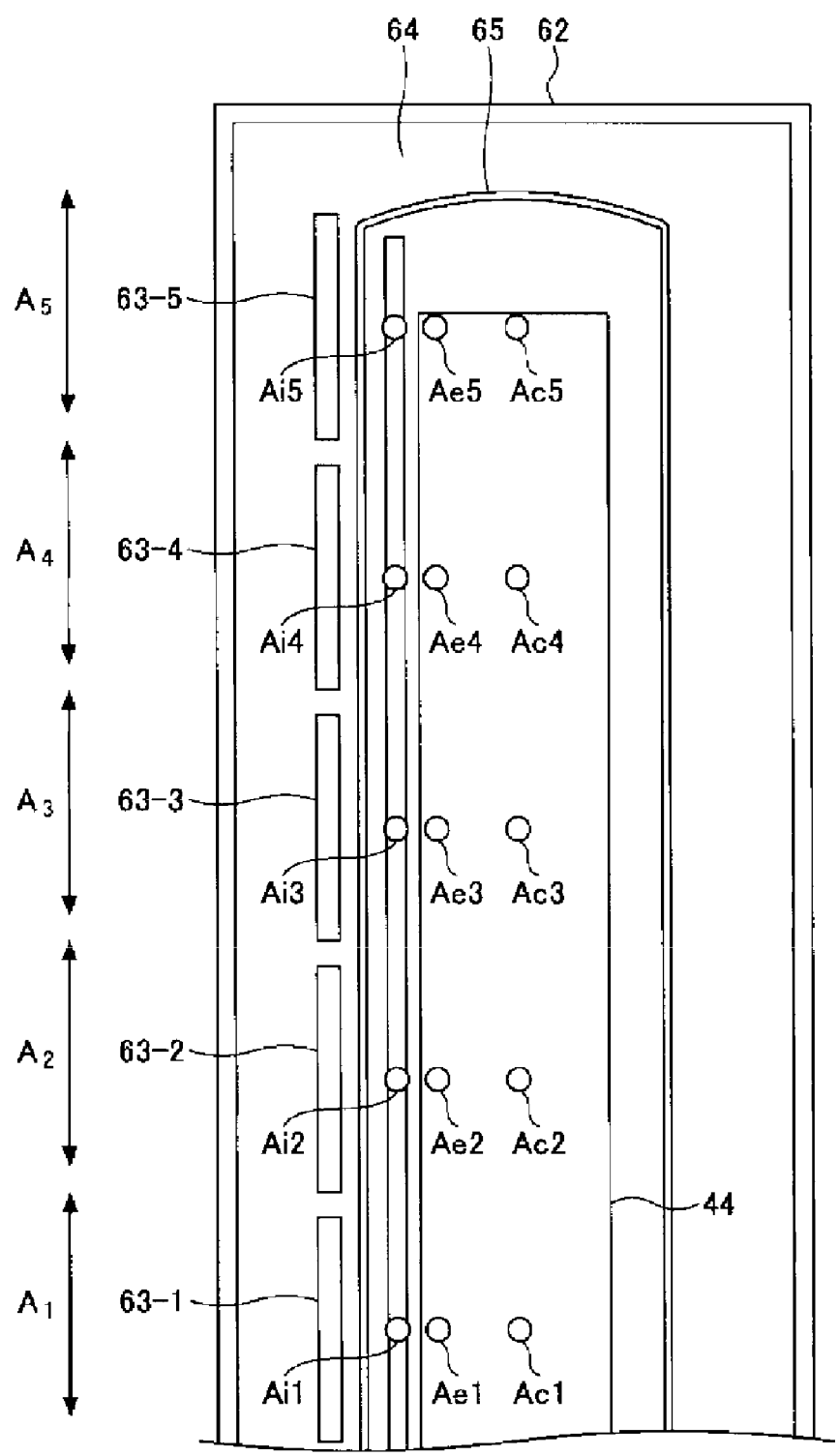
FIG. 6 is a schematic longitudinal elevational view of an illustrative heat treatment apparatus which is simplified by decreasing the number of unit regions.
Figure 7:
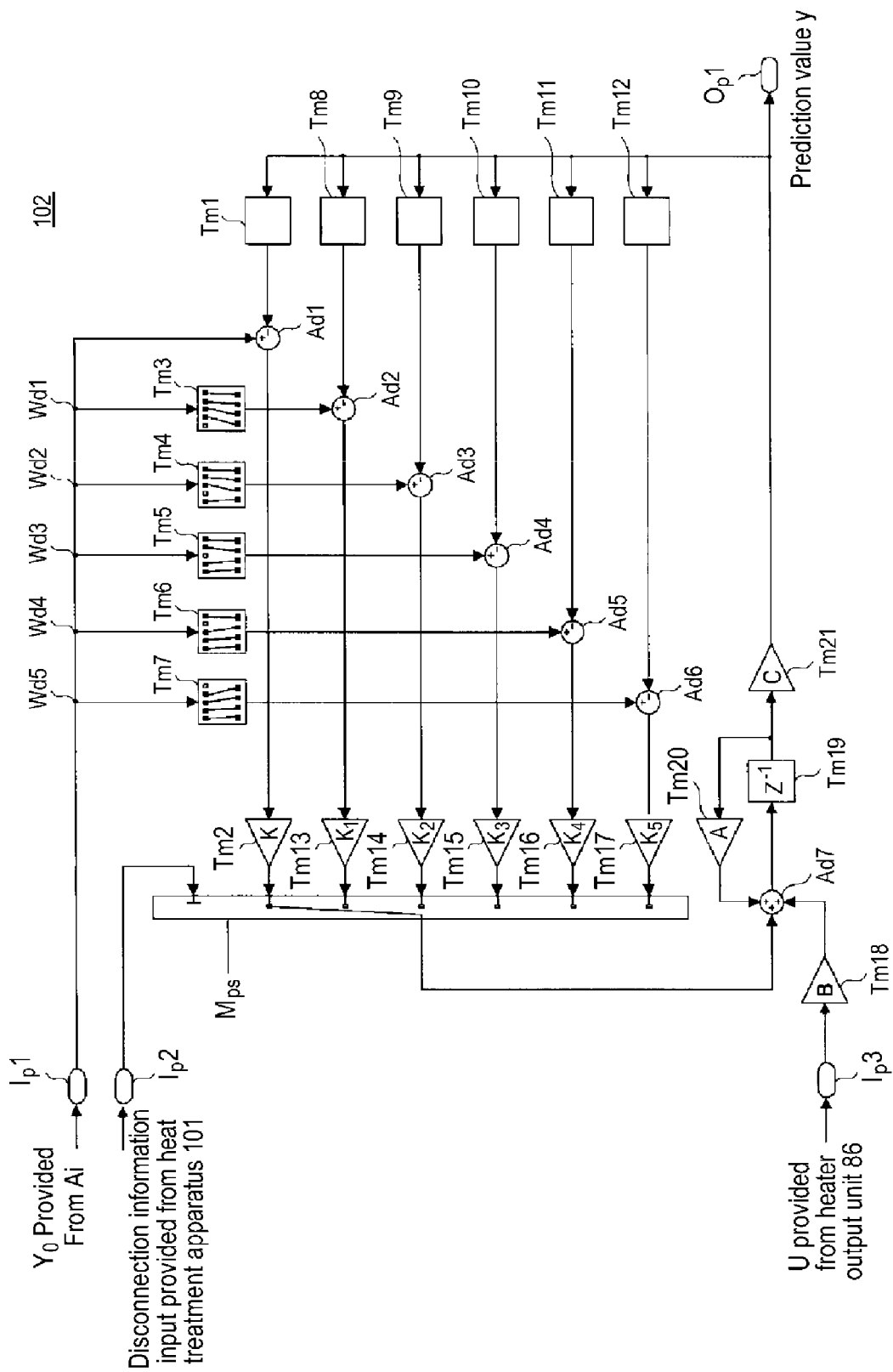
FIG. 7 is a block diagram schematically showing a configuration of a prediction unit.

As shown in FIG. 6, the heat treatment apparatus 10 is partitioned into the five unit regions A1 to A5. Each of the five heating elements 63-1 to 63-5 is disposed to correspond to each of the five unit regions A1 to A5, and each of the five in-vessel temperature sensors Ai1 to Ai5 is also disposed to correspond to each of the five unit regions A1 to A5. Further, each of five center temperature sensors Ac1 to Ac5 is disposed at a position corresponding to the center of each wafer W held by the boat 44 in each of the five unit regions A1 to A5, respectively. Further, each of five edge temperature sensors Ae1 to Ae5 is disposed at a position corresponding to an edge of each wafer W held by the boat 44 in each of the five unit regions A1 to A5, respectively. The numbers as described above may be defined as follows:

Dimensional number n=20
Output number m=15
Input number r=5
Observation number o=5

Further, the five center temperature sensors Ac1 to Ac5 may be disposed in the boat 44, and may be disposed by holding the wafers W, each having a thermocouple formed at its center position, when preparing the Kalman filter. Further, the edge temperature sensors Ae1 to Ae5 may be disposed in the boat 44, and may be disposed by holding the wafers W, each having a thermocouple formed at its edge position, when preparing the Kalman filter.

In this case, a state vector x of n rows×1 column may be given as 20 rows×1 column as defined in the following equation Eq. (26).

$$x = \begin{Bmatrix} x_1 \\ \vdots \\ x_{20} \end{Bmatrix} \qquad \text{Eq. (26)}$$

The input vector u of r rows×1 column may be given as 5 rows×1 column as defined the following equation Eq. (27).

$$u = \begin{Bmatrix} u_1 \\ \vdots \\ u_5 \end{Bmatrix} \qquad \text{Eq. (27)}$$

wherein, each of u1 to u5 corresponds to a respective output of the heating elements 63-1 to 63-5.

The output vector y of m rows×1 column may be given as 15 rows×1 column as defined in the following equation Eq. (28).

$$y = \begin{Bmatrix} y_{inner,1} \\ \vdots \\ y_{inner,5} \\ y_{center,1} \\ y_{edge,1} \\ \vdots \\ y_{center,5} \\ y_{edge,5} \end{Bmatrix} \qquad \text{Eq. (28)}$$

wherein, $y_{inner,1}$ to $y_{inner,5}$ correspond to a respective temperature of each of the in-vessel temperature sensors Ai1 to Ai5, $y_{center,1}$ to $y_{center,5}$ correspond to a respective temperature of each of the center temperature sensors Ac1 to Ac5, and $y_{edge,1}$ to $y_{edge,5}$ correspond to a respective temperature of each of the edge temperature sensors Ae1 to Ae5.

The observation vector $y_0$ of o rows×1 column may be given as 5 rows×1 column as defined in the following equation Eq. (29).

$$y_o = \begin{Bmatrix} y_{inner,1} \\ y_{inner,2} \\ y_{inner,3} \\ y_{inner,4} \\ y_{inner,5} \end{Bmatrix} \quad \text{Eq. (29)}$$

In addition, the observation vector $y_1$, $y_2$, $y_3$, $y_4$ and $y_5$ of (o-1) rows×1 column may be given as 4 rows×1 column as defined in the following equations Eq. (30) to Eq. (34).

$$y_1 = \begin{Bmatrix} y_{inner,2} \\ y_{inner,3} \\ y_{inner,4} \\ y_{inner,5} \end{Bmatrix} \quad \text{Eq. (30)}$$

$$y_2 = \begin{Bmatrix} y_{inner,1} \\ y_{inner,3} \\ y_{inner,4} \\ y_{inner,5} \end{Bmatrix} \quad \text{Eq. (31)}$$

$$y_3 = \begin{Bmatrix} y_{inner,1} \\ y_{inner,2} \\ y_{inner,4} \\ y_{inner,5} \end{Bmatrix} \quad \text{Eq. (32)}$$

$$y_4 = \begin{Bmatrix} y_{inner,1} \\ y_{inner,2} \\ y_{inner,3} \\ y_{inner,5} \end{Bmatrix} \quad \text{Eq. (33)}$$

$$y_5 = \begin{Bmatrix} y_{inner,1} \\ y_{inner,2} \\ y_{inner,3} \\ y_{inner,4} \end{Bmatrix} \quad \text{Eq. (34)}$$

wherein, each of $y_1$, $y_2$, $y_3$, $y_4$ and $y_5$ is an observation vector when each of the in-vessel temperature sensors Ai1 to Ai5, respectively, is broken.

Also, the state matrix A of n rows×n columns may be given as 20 rows×20 column as defined in the following equation Eq. (35).

$$A = \begin{bmatrix} a_{1,1} & \cdots & a_{1,20} \\ \vdots & \ddots & \\ a_{20,1} & & a_{20,20} \end{bmatrix} \quad \text{Eq. (35)}$$

The input matrix B of n rows×r columns may be given as 20 rows×5 columns as defined in the following equation Eq. (36).

$$B = \begin{bmatrix} b_{1,2} & \cdots & b_{1,5} \\ \vdots & \ddots & \\ b_{20,1} & & b_{20,5} \end{bmatrix} \quad \text{Eq. (36)}$$

The output matrix C of m rows×n columns may be given as 15 rows×20 columns as defined in the following equation Eq. (37).

$$C = \begin{bmatrix} c_{1,1} & \cdots & c_{1,20} \\ \vdots & \ddots & \\ c_{15,1} & & c_{15,20} \end{bmatrix} \quad \text{Eq. (37)}$$

The observation value selection matrix $C_0$ of o rows×m columns may be given as 5 rows×15 columns as defined in the following equation Eq. (38).

$$C_o = \begin{bmatrix} 1 & 0 & 0 & 0 & 0 & 0 & \cdots & 0 \\ 0 & 1 & 0 & 0 & 0 & & & \\ 0 & 0 & 1 & 0 & 0 & \vdots & \ddots & \vdots \\ 0 & 0 & 0 & 1 & 0 & & & \\ 0 & 0 & 0 & 0 & 1 & 0 & \cdots & 0 \end{bmatrix} \quad \text{Eq. (38)}$$

Also, the observation value selection matrices $C_1$, $C_2$, $C_3$, $C_4$, and $C_5$ of (o-1) rows×m columns may be given as 4 rows×15 columns as defined in the following equations Eq. (39) to Eq. (43).

$$C_1 = \begin{bmatrix} 0 & 1 & 0 & 0 & 0 & 0 & \cdots & 0 \\ 0 & 0 & 1 & 0 & 0 & \vdots & \ddots & \vdots \\ 0 & 0 & 0 & 1 & 0 & & & \\ 0 & 0 & 0 & 0 & 1 & 0 & \cdots & 0 \end{bmatrix} \quad \text{Eq. (39)}$$

$$C_2 = \begin{bmatrix} 1 & 0 & 0 & 0 & 0 & 0 & \cdots & 0 \\ 0 & 0 & 1 & 0 & 0 & \vdots & \ddots & \vdots \\ 0 & 0 & 0 & 1 & 0 & & & \\ 0 & 0 & 0 & 0 & 1 & 0 & \cdots & 0 \end{bmatrix} \quad \text{Eq. (40)}$$

$$C_3 = \begin{bmatrix} 1 & 0 & 0 & 0 & 0 & 0 & \cdots & 0 \\ 0 & 1 & 0 & 0 & 0 & \vdots & \ddots & \vdots \\ 0 & 0 & 0 & 1 & 0 & & & \\ 0 & 0 & 0 & 0 & 1 & 0 & \cdots & 0 \end{bmatrix} \quad \text{Eq. (41)}$$

$$C_4 = \begin{bmatrix} 1 & 0 & 0 & 0 & 0 & 0 & \cdots & 0 \\ 0 & 1 & 0 & 0 & 0 & \vdots & \ddots & \vdots \\ 0 & 0 & 1 & 0 & 0 & & & \\ 0 & 0 & 0 & 0 & 1 & 0 & \cdots & 0 \end{bmatrix} \quad \text{Eq. (42)}$$

$$C_5 = \begin{bmatrix} 1 & 0 & 0 & 0 & 0 & 0 & \cdots & 0 \\ 0 & 1 & 0 & 0 & 0 & \vdots & \ddots & \vdots \\ 0 & 0 & 1 & 0 & 0 & & & \\ 0 & 0 & 0 & 1 & 0 & 0 & \cdots & 0 \end{bmatrix} \quad \text{Eq. (43)}$$

wherein, each of $C_1$, $C_2$, $C_3$, $C_4$ and $C_5$ is an observation value selection matrix when each of the in-vessel temperature sensors Ai1 to Ai5, respectively, is broken.

Also, the Kalman gain K in the normal situation of n rows×o columns may be given as 20 rows×5 columns as defined in the following equation Eq. (44).

$$K = \begin{bmatrix} k_{1,1} & \cdots & k_{1,5} \\ \vdots & \ddots & \\ k_{20,1} & & k_{20,5} \end{bmatrix} \quad \text{Eq. (44)}$$

The Kalman gain $K_i$ in the abnormal situation of n rows× (o-1) columns may be given as 20 rows×4 columns as defined in the following equation Eq. (45).

$$K_i = \begin{bmatrix} k_{1,1}^i & \cdots & k_{1,4}^i \\ \vdots & \ddots & \\ k_{20,1}^i & & k_{20,4}^i \end{bmatrix} \quad \text{Eq. (45)}$$

The covariance matrix Q for process noise of n rows×n columns may be given as 20 rows×20 columns as defined in the following equation Eq. (46).

$$Q = \begin{bmatrix} 1 & & 0 \\ & \ddots & \\ 0 & & 1 \end{bmatrix} \quad \text{Eq. (46)}$$

The covariance matrix $R_o$ for observation noise in the normal situation of o rows×o columns may be given as 5 rows×5 columns as defined in the following equation Eq. (47).

$$R_o = \begin{bmatrix} 1 & & 0 \\ & \ddots & \\ 0 & & 1 \end{bmatrix} \quad \text{Eq. (47)}$$

The covariance matrix $R_i$ for observation noise of (o-1) rows×(o-1) columns may be given as 4 rows×4 columns as defined in the following equation Eq. (48).

$$R_i = \begin{bmatrix} 1 & & 0 \\ & \ddots & \\ 0 & & 1 \end{bmatrix} \quad \text{Eq. (48)}$$

As shown in FIG. 7, the prediction unit 102 includes transfer elements Tm1 to Tm21, adders Ad1 to Ad7, a multiport switch Mps, input points Ip1 to Ip3, and an output point Op1.

The signal $y_o$, which is composed of the temperature detection signals $y_{inner,1}$ to $y_{inner,5}$ provided from the in-vessel temperature sensors Ai1 to Ai5, is inputted through the input point Ip1. The signal $y_o$ inputted through the input point Ip1 is directly inputted to the adder Ad1, or is drawn via each of five drawing points Wd1 to Wd5.

In the adder Ad1, the signal $y_o$ inputted directly thereto is added to a signal which is inputted via the transfer element Tm1 at a time k, and then, the added value is multiplied with a Kalman filter K for the normal situation by the transfer element Tm2. The multiplied value is directed to the multiport switch Mps.

Also, the signal $y_o$ drawn from each of the drawing points Wd1 to Wd5 may be inputted to the respective adders Ad2 to AD6 through the respective transfer elements Tm3 to Tm7. Each of the transfer elements Tm3 to Tm7 selects four detection signals of the five detection signals $y_{inner,1}$ to $y_{inner,5}$ of $y_o$ and outputs the same to the respective adders Ad2 to Ad6 as $y_1$ to $y_5$ as defined in the equations Eq. (30) to Eq. (34). At each of the adders Ad2 to Ad6, each of the values $y_1$ to $y_5$ inputted thereto is added/subtracted to/from a respective signal which is inputted through the respective transfer elements Tm8 to Tm12 at a time k. Thereafter, at the transfer elements Tm13 to Tm17, each of the added/subtracted values is multiplied with a respective Kalman filter $K_1$ to $K_5$ in the abnormal situation. Each of the multiplied values is directed to the multiport switch Mps.

The detection signal of the failure detection unit 101 is inputted to the multiport switch Mps via the input point Ip2. When none of the in-vessel temperature sensors Ai are broken, a signal corresponding to the normal situation is inputted to the multiport switch Mps. In this case, the multiport switch Mps outputs the signal inputted from the transfer element Tm2.

An output signal of the multiport switch Mps is inputted to the adder Ad7. Further, a signal is also inputted to the adder Ad7, which is obtained by multiplying the input vector u inputted through the input point Ip3 with the input matrix B as defined in the above Eq. (36) at the transfer element Tm18, the input vector u being composed of the outputs u1 to u5 of the heater output unit 86 as defined in the above Eq. (27). An output signal of the adder Ad7 is provided to the transfer element Tm19 in which the output signal is delayed by one unit time, and then the delayed signal is directed to the transfer element Tm20 in which the delayed signal is multiplied with the state matrix A as defined in the above equation Eq. (35). The multiplied signal of the multiport switch Mps is then inputted to the adder Ad7.

The adder Ad7 performs an addition/subtraction operation on the three signals inputted thereto as described above, and outputs the same to the transfer element Tm19. The output signal of the transfer element Tm19 is provided to the transfer element Tm21 in which the output signal is multiplied with the output matrix C as defined in the above equation Eq. (37). The multiplied signal is outputted as the output vector y via the output point Op1. The output vector y is also provided to each of the transfer elements Tm1 and Tm8 to Tm12 as a signal at a time k+1. This signal is used to predict the output vector y at the time k+1.

When none of the in-vessel temperature sensors Ai1 to Ai5 are broken, an estimation algorithm for predicting the output vector y using the Kalman filter for the normal situation corresponds to a second estimation algorithm of the present disclosure.

When one of the in-vessel temperature sensors Ai is broken, the failure detection unit 101 sends a detection signal indicating the broken temperature sensor to the multiport switch Mps. In response to the detection signal, the multiport switch Mps outputs one of the signals $y_1$ to $y_5$ composed of four detection signals that excludes the detection signal indicating the broken temperature sensor. Similar to when none of the in-vessel temperature sensors Ai1 are broken, the output vector y is outputted through the output point Op1.

Further, when one of the in-vessel temperature sensors Ai is broken, the estimation algorithm for predicting the output vector y using the Kalman filter for the abnormal situation corresponds to a first estimation algorithm of the present disclosure.

In this embodiment, when one of the in-vessel temperature sensors Ai is broken, a temperature of each of the plurality of in-vessel temperature sensors Ai is estimated by using the Kalman filter for the abnormal situation, based on a detection value detected at each of the in-vessel temperature sensors Ai excluding the broken in-vessel temperature sensor. Specifically, when none of the in-vessel temperature sensors Ai are broken, the Kalman filter for the abnormal situation is prepared based on detection values that are detected at each of the in-vessel temperature sensors Ai excluding a selected in-vessel temperature sensor Ai from the in-vessel temperature sensors Ai. Further, when a selected in-vessel temperature sensor Ai is broken, the temperature of each of the in-vessel temperature sensors Ai is estimated by the prepared Kalman filter for the abnormal situation. This allows a continuous temperature control without substantially changing the temperature of each wafer W, even when one of the in-vessel temperature sensors Ai is broken.

Further, even when none of the in-vessel temperature sensors Ai are broken, the output vector y is estimated by the Kalman filter for the normal situation based on the signal $y_o$. The same state space model is used in both the normal and abnormal situations so that the state variable x is shared in the model, thereby making it possible to continuously calculate the temperature of each wafer W. Therefore, although the method of predicting the output vector y in the abnormal situation is changed, a continuous temperature control can be achieved without substantially changing the temperature of each wafer W.

Further, since the same observer (or an observation device) is used in both the normal and abnormal situations, there is no need to create a new observer as an observer in the abnormal situation. Further, a state prediction model in an abnormal situation is created by five Kalman gains such as K1 to K5, which makes it possible to prevent the size of the model from being increased.

In the above, the Kalman filter has been described to be used as the observer, but the present disclosure is not limited thereto. For example, a minimum dimensional observer, a VSS observer or the like may be used as the observer.

Although the above embodiment has been described in which the output vector y is predicted based on the signal $y_o$ when none of the in-vessel temperature sensors Ai are out of order, the present disclosure is not limited thereto. For example, as indicated by a dotted line i in FIG. 5, when none of the in-vessel temperature sensors Ai are out of order, the operation unit 103 may set the setting value to be provided to the heater output unit 86, based on the signal $y_o$ that is provided directly from the in-vessel temperature sensors Ai, instead of predicting the output vector y using the Kalman filter.

The following is a description of a heat treatment method, which may be applied to the heat treatment application according to the present disclosure.

Figure 8:
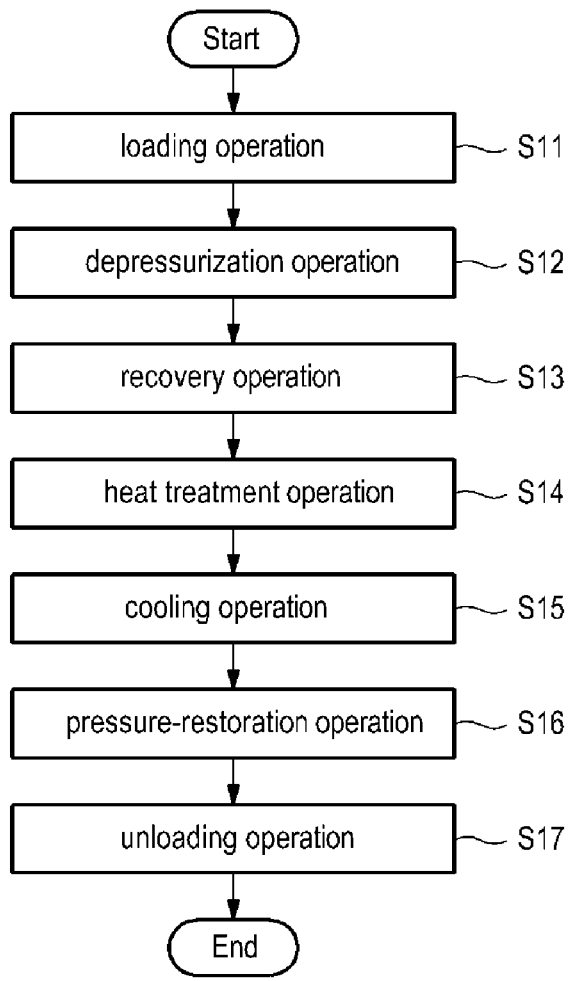
FIG. 8 is a flowchart illustrating a sequence of procedures which are performed in a heat treatment method for use in a heat treatment apparatus of the present disclosure.

FIG. 8 is a flowchart illustrating a sequence of procedures which are performed in a heat treatment method applied to the heat treatment apparatus of the present disclosure.

First, in one embodiment (or one example), each wafer W is loaded into the processing vessel 65 in step S11 (a loading operation). In an example of the heat treatment apparatus 10 as shown in FIG. 1, the wafers W are mounted from the receiving vessel 21 to the boat 44a by the transfer mechanism 47 in the loading area 40, and then, the boat 44a with the wafers W mounted therein is mounted on the lid 43 by the boat transfer mechanism 45c. The lid 43 with the boat 44a mounted thereon is moved upward by the elevating mechanism 46 so that the boat 44a is loaded into the processing vessel 65. In this way, the wafers W can be loaded into the processing vessel 65.

Subsequently, the inside of the processing vessel 65 is depressurized in step S12 (a depressurization operation). The amount of gas to be exhausted from the processing vessel 65 via the exhaust port 73 may be increased by adjusting an exhausting capacity of the exhaust system 74 or a flow rate control valve (not shown) installed between the exhaust system 74 and the exhaust port 73. In this way, the inside of the processing vessel 65 is depressurized to a predetermined pressure.

Thereafter, in step S13, the temperature of each wafer W is increased up to a predetermined temperature (or a heat treatment temperature) at which the wafer W is heat-treated (a recovery operation).

Immediately after the boat 44a is loaded into the processing vessel 65, a temperature of the processing vessel 65, e.g., the temperatures detected by the movable temperature sensors Ap1 to Ap10, is reduced to around a room temperature. For this reason, an electric power is supplied to the heater 63 so that the temperature of each wafer W held in the boat 44a is increased up to the heat treatment temperature.

Further, a balance of a heat discharge rate of the heater 63 and a cooling rate of the cooling mechanism 90 may be maintained such that the temperature of each wafer W is controlled to converge to the heat treatment temperature.

Subsequently, in step S14, each wafer W held in the boat 44 is subjected to the heat treatment by the heater 63 (a heat treatment operation).

Maintenance of the temperature of each wafer W at the predetermined temperature is achieved by allowing the lid member 43 to hold the plurality of wafers W with a predetermined vertical interval therebetween, and allowing the heater 63 to heat the processing vessel 65. In this configuration, the process gas is supplied from the gas supply source 72 to the inside of the processing vessel 65 through the injector 71 so that the surfaces of the wafers W are heat-treated. For example, the process gas composed of, e.g., water vapor gas is supplied to oxidize the surfaces of the wafers W. Although the oxidization process has been used as one example of the heat treatment for the wafers W, the present disclosure is not limited thereto. For example, various kinds of heat treatments such as diffusion, Low Pressure Chemical Vapor Deposition (CVD) or the like may be performed on the wafers W.

Thereafter, in step S15, the cooling mechanism 90 supplies cooling gas to the space 64 via each of a plurality of gas injection openings 92a-1 to 92a-10 such that the processing vessel 65 is cooled, which allows the temperatures of the wafers W to be decreased below the heat treatment temperature (a cooling operation). At this time, the cooling gas generated from the ventilator 91 is supplied to the space 64 to thereby cool the wafers W which have been subjected to the heat treatment.

Thereafter, in step S16, the inside of the processing vessel 65 is restored to the atmospheric pressure (a pressure-restoration operation). The amount of gas to be exhausted from the processing vessel 65 is decreased by adjusting the exhausting capacity of the exhaust system 74 or the flow rate control valve (not shown) installed between the exhaust system 74 and the exhaust port 73. Then, for example, nitrogen (N2) purge gas is introduced into the processing vessel 65 such that the pressure within the processing vessel 65 is restored to the atmospheric pressure.

Subsequently, in step S17, the wafers W are unloaded from the processing vessel 65 (an unloading operation). In an example of the heat treatment apparatus 10 as shown in FIG. 1, the lid 43 on which the boat 44a is mounted is moved downward by the elevating mechanism 46 such that the boat 44a can be unloaded from the processing vessel 65 to the loading area 40. Then, the transfer mechanism 47 transfers the wafers W from the unloaded boat 44a mounted on the lid 43 to the receiving vessel 21, thereby unloading the wafers W from the processing vessel 65. In this way, the wafers W are unloaded from the processing vessel 65 and the heat treatment operation is terminated.

Further, in the case where the heat treatment operation is continuously performed on a plurality of batches of wafers W, wafers W of one batch are transferred from the receiving vessel 21 to the boat 44 by the transfer mechanism 47 in the loading area 40, and the control process returns to step S11 where wafers W of a subsequent batch are subjected to the heat treatment.

In the heat treatment method as described above, when one of the in-vessel temperature sensors Ai is broken, the temperature of each of the plurality of in-vessel temperature sensors Ai is estimated by using the Kalman filter for the abnormal situation, based on the temperature detection values detected by each of the in-vessel temperature sensors Ai excluding the broken in-vessel temperature sensor. Therefore, even if one of the in-vessel temperature sensors Ai is broken, it is possible to continuously control the temperatures of the wafers W without substantially changing the temperatures of the wafers W.

Moreover, although in the above embodiments, the substrates have been described to be held along an up-down direction, the present disclosure is not limited thereto. For example, the present disclosure may be applied to a case where the substrates are held at a predetermined interval along a certain direction. Further, the temperature control apparatus which employs the temperature control method according to the present disclosure is not limited to the case where the substrates are subjected to heat treatment with the substrates held in the processing vessel. Alternatively, the temperature control apparatus may be applied to heating various kinds of objects to be heated other than substrates. In some embodiments, even when one of temperature sensors (or temperature detection element) located at different positions is broken, the temperature of each of the plurality of temperature sensors may be estimated using the Kalman filter for the abnormal situation, based on detection values detected by each of the temperature sensors excluding the broken temperature sensor. Further, the temperatures of the objects to be heated may be controlled based on the estimation value.

According to the present disclosure in some embodiments, it is possible to continuously control temperatures of objects to be heated without substantially changing the temperatures of the objects, even when one of the temperature detection elements is broken (or out of order).

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A temperature control apparatus, comprising:
    a plurality of temperature detection elements, each of the temperature detection elements being positioned at different positions;
    a failure detection unit configured to detect whether one of the temperature detection elements is broken;
    a heating unit provided with a plurality of heating elements, each of the heating elements being positioned at different positions, and configured to heat objects to be heated; and
    a control unit configured to adjust a heating rate of each of the plurality of heating elements in the heating unit, based on temperature detection values detected at the plurality of temperature detection elements, and configured to control temperatures of the objects to be heated, wherein, the control unit is further configured to estimate a temperature for each of the temperature detection elements and configured to control the temperatures of the objects to be heated based on the estimated temperatures,
    wherein a first Kalman filter is prepared using the temperature detection values, from which a first temperature detection value corresponding to a selected temperature detection element among the temperature detection elements is excluded, when none of the temperature detection elements are broken, and
    wherein the prepared first Kalman filter and temperature detection values are used by the control unit to estimate the temperature of each of the temperature detection elements when the selected temperature detection element is broken.

2. The temperature control apparatus of claim 1, wherein a first estimation algorithm is configured to estimate the temperature of each of the plurality of temperature detection elements by using the first Kalman filter.

3. The temperature control apparatus of claim 2, wherein the temperature of each of the plurality of temperature detection elements is estimated when one of the plurality of temperature detection elements is broken based on the temperature detection values and the heating rate of each of the plurality of heating elements,
    wherein each of the plurality of heating elements is disposed to correspond to each of the temperature detection elements.

4. The temperature control apparatus of claim 1, wherein the temperature of each of the plurality of temperature detection elements is estimated by using a second estimation algorithm for estimating the temperature of each of the plurality of the temperature detection elements when none of the plurality of temperature detection elements are broken, based on the temperature detection values detected at the plurality of temperature detection elements, such that the temperatures of the object to be heated are controlled based on the temperatures estimated by the second estimation algorithm.

5. The temperature control apparatus of claim 4, wherein the second estimation algorithm is configured to estimate the temperature of each of the plurality of temperature detection elements by using a second Kalman filter.

6. The temperature control apparatus of claim 5, wherein the temperature of each of the plurality of temperature detection elements are estimated when none of the plurality of temperature detection elements are broken based on the temperature detection values and the heating rates of each of the plurality of heating elements,
    wherein each of the plurality of heating elements is disposed to correspond to each of the temperature detection elements.

7. A heat treatment apparatus for performing a heat treatment on substrates, comprising:
    a processing vessel;
    a substrate holding unit disposed in the processing vessel and configured to hold the substrates with a predetermined interval therebetween along one direction;
    a heating unit provided with a plurality of heating elements, each of the heating elements being positioned at different positions along the one direction, and configured to heat the substrates held by the substrate holding unit in the processing vessel;
    a plurality of temperature detection elements, each of the temperature detection elements being positioned at different positions along the one direction;
    a failure detection unit configured to detect whether one of the temperature detection elements is broken; and a control unit configured to adjust a heating rate of each of the plurality of heating elements in the heating unit, based on temperature detection values detected at the plurality of temperature detection elements, and configured to control temperatures of the substrates, wherein the control unit is further configured to estimate a temperature for each of the temperature detection elements, and configured to control the temperatures of the substrates based on the estimated temperatures, wherein a first Kalman filter is prepared using the temperature detection values, from which a first temperature detection value corresponding to a selected temperature detection element among the temperature detection elements is excluded, when none of the temperature detection elements are broken, and wherein the prepared first Kalman filter and temperature detection values are used by the control unit to estimate the temperature of each of the temperature detection elements when the selected temperature detection element is broken.

8. The heat treatment apparatus of claim 7, wherein a first estimation algorithm is configured to estimate the temperature of each of the plurality of temperature detection elements by using the first Kalman filter.

9. The heat treatment apparatus of claim 8, wherein the control unit is configured to estimate the temperature of each of the plurality of temperature detection elements when one of the plurality of temperature detection elements is broken based on the temperature detection values and the heating rate of each of the plurality of heating elements, wherein each of the plurality of heating elements is disposed to correspond to each of the temperature detection elements.

10. The heat treatment apparatus of claim 7, wherein the control unit is configured to estimate the temperature of each of the plurality of temperature detection elements by using a second estimation algorithm for estimating the temperature of each of the plurality of the temperature detection elements when none of the plurality of temperature detection elements are broken, based on the temperature detection values detected at the plurality of temperature detection elements, and configured to control the temperatures of the substrates based on the estimated temperatures.

11. The heat treatment apparatus of claim 10, wherein the second estimation algorithm is configured to estimate the temperature of each of the plurality of temperature detection elements by using a second Kalman filter.

12. The heat treatment apparatus of claim 11, wherein the control unit is configured to estimate the temperature of each of the plurality of temperature detection elements when none of the plurality of temperature detection elements are broken based on the temperature detection values and the heating rate of each of the plurality of heating elements, and wherein each of the plurality of heating elements is disposed to correspond to each of the temperature detection elements.

* * * * *